United States Patent
Yang (10) Patent No.: US 10,666,232 B2
(45) Date of Patent: May 26, 2020

(54) LEVEL SHIFTER AND MEMORY SYSTEM INCLUDING THE SAME

(71) Applicant: SK hynix Inc., Gyeonggi-do (KR)

(72) Inventor: Yu Jin Yang, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/202,521

(22) Filed: Nov. 28, 2018

(65) Prior Publication Data

US 2019/0334506 A1 Oct. 31, 2019

(30) Foreign Application Priority Data

Apr. 27, 2018 (KR) .................. 10-2018-0048877

(51) Int. Cl.
| | |
|---|---|
| *G11C 7/10* | (2006.01) |
| *H03K 3/012* | (2006.01) |
| *H03K 19/0185* | (2006.01) |
| *H03K 3/356* | (2006.01) |

(52) U.S. Cl.
CPC .............. *H03K 3/012* (2013.01); *G11C 7/10* (2013.01); *H03K 3/356113* (2013.01); *H03K 19/018521* (2013.01)

(58) Field of Classification Search
CPC .. G11C 7/10; H03K 3/012; H03K 19/018521; H03K 3/356113
See application file for complete search history.

(56) References Cited

U.S. PATENT DOCUMENTS

| | | | | |
|---|---|---|---|---|
| 6,344,764 B2* | 2/2002 | Tanzawa | ................ | G11C 8/08 326/68 |
| 6,437,627 B1* | 8/2002 | Tran | ................ | H03K 3/356052 327/333 |
| 6,812,746 B2* | 11/2004 | Gans | ................ | G11C 7/065 327/51 |
| 7,609,090 B2* | 10/2009 | Srivastava | ............ | H03K 3/012 326/68 |
| 9,270,275 B2* | 2/2016 | Song | ................ | H03K 19/0185 |
| 9,553,585 B1* | 1/2017 | Song | ................ | H03M 9/00 |
| 2002/0145461 A1* | 10/2002 | Horan | ............ | H03K 19/01852 327/333 |
| 2005/0275430 A1* | 12/2005 | Kim | ................ | H03K 3/356113 326/81 |
| 2007/0290735 A1* | 12/2007 | Ali | ................ | H03K 3/012 327/333 |

(Continued)

FOREIGN PATENT DOCUMENTS

| | | |
|---|---|---|
| KR | 100774459 | 11/2007 |
| KR | 1020150086711 | 7/2015 |

*Primary Examiner* — Khamdan N. Alrobaie
(74) *Attorney, Agent, or Firm* — IP & T Group LLP (57) ABSTRACT

There are provided a level shifter and a memory system including the same. The level shifter includes: a pull-up unit for supplying an internal power supply voltage to a first output node or a second output node in response to an input signal and an inverted input signal; a pull-down unit for applying a ground voltage to the first output node or the second output node in response to potential levels of the first output node and the second output node; and a discharge unit for discharging the potential level of the first output node or the second output node in response to the input signal and the inverted input signal.

13 Claims, 4 Drawing Sheets

(56) References Cited

U.S. PATENT DOCUMENTS

| | | | | |
|---|---|---|---|---|
| 2008/0238523 | A1* | 10/2008 | Thorp | H03K 3/35613 |
| | | | | 327/333 |
| 2009/0315610 | A1* | 12/2009 | Han | G09G 3/3696 |
| | | | | 327/333 |
| 2012/0294096 | A1* | 11/2012 | Nishijima | G11C 11/412 |
| | | | | 365/189.11 |
| 2016/0294373 | A1* | 10/2016 | Grubelich | H03K 3/356104 |
| 2018/0062655 | A1* | 3/2018 | Park | H03K 19/01850 |
| 2019/0334506 | A1* | 10/2019 | Yang | G11C 7/10 |

* cited by examiner

LEVEL SHIFTER AND MEMORY SYSTEM INCLUDING THE SAME

CROSS-REFERENCE TO RELATED APPLICATION

The present application claims priority under 35 U.S.C. § 119(a) to Korean patent application number 10-2018-0048877, filed on Apr. 27, 2018, which is incorporated herein by reference in its entirety.

BACKGROUND

1. Field of Invention

The present disclosure generally relates to an electronic device and, more particularly, to a level shifter and a memory system including the same.

2. Description of Related Art

As mobile information devices using memory systems as storage media, particularly, smartphones, tablet personal computers (PCs), and the like are increasingly used, interest and importance in memory devices have been further increased.

As various applications appear in addition to parallelization using high-speed processors or multicores, demand levels for semiconductor memory systems have been continuously increased in terms of not only performance but also reliability.

A memory system is a storage device implemented using a semiconductor such as silicon (Si), germanium (Ge), gallium arsenide (GaAs), or indium phosphide (InP). A memory system may be generally classified into a volatile and a nonvolatile memory system depending on whether it employs a volatile or a non-volatile memory device. A volatile memory device is a memory device in which stored data disappears when the supply of power is interrupted. Examples of a volatile memory device include a static random access memory (SRAM), a dynamic RAM (DRAM), a synchronous DRAM (SDRAM), and the like. A nonvolatile memory device is a memory device in which stored data is retained even when the supply of power is interrupted. Examples of a nonvolatile memory device include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. A flash memory is generally classified into a NOR type flash memory and a NAND type flash memory.

A memory system may include a memory device for storing data and a memory controller for controlling the memory device. The memory device and the memory controller may use different power supply voltages. Therefore, there is required an interface circuit for changing voltage levels of signals transmitted and received between the memory device and the memory controller, and the interface circuit is referred to as a level shifter.

SUMMARY

Embodiments provide a level shifter having an improved switching speed of the level of an output signal and a memory system including the level shifter.

In accordance with an aspect of the present disclosure, there is provided a level shifter including: a pull-up unit configured to supply an internal supply power voltage to a first output node or a second output node in response to an input signal and an inverted input signal; a pull-down unit configured to apply a ground voltage to the first output node or the second output node in response to potential levels of the first output node and the second output node; and a discharge unit configured to discharge the potential level of the first output node or the second output node in response to the input signal and the inverted input signal.

In accordance with another aspect of the present disclosure, there is provided a level shifter including: a pull-up unit configured to supply an internal power supply voltage to a first output node or a second output node in response to potential levels of the first output node and the second output node; a pull-down unit configured to supply a ground voltage to the first output node or the second output node in response to an input signal and an inverted input signal; and a charge unit configured to increase the potential level of the first output node or the second output node in response to the input signal and the inverted input signal.

In accordance with still another aspect of the present disclosure, there is provided a memory system including: a memory device including an internal circuit; a memory controller configured to output an input signal for controlling the memory device in response to a request from a host; and a level shifter configured to shift the level of the input signal and output the shifted input signal to the internal circuit, wherein the level shifter includes: a pull-up unit configured to supply an internal power supply voltage to a first output node and a second output node in response to the input signal and an inverted input signal; a pull-down unit configured to apply a ground voltage to the first output node or the second output node in response to potential levels of the first output node and the second node; and a discharge unit configured to discharge the potential level of the first output node or the second output node in response to the input signal and the inverted input signal.

In accordance with still another aspect of the present disclosure, there is provided a level shifter comprising: a first input node suitable for receiving an input signal; a second input node suitable for receiving an inverted input signal; a first output node; a second output node; a level shifting circuit suitable for shifting levels of the input signal and the inverted input signal, outputting the level-shifted input signal as a first output signal through the second output node, and outputting the level-shifted inverted input signal as a second output signal through the first output node; and a charging/discharging component suitable for charging or discharging the first and second output nodes when the input signal and the inverted input signal is transitioned.

BRIEF DESCRIPTION OF THE DRAWINGS

Example embodiments will now be described more fully hereinafter with reference to the accompanying drawings; however, it is noted that the invention and its various embodiments may be embodied in different forms and should not be construed as limited only to the embodiments set forth herein. Rather, these embodiments are provided so that this disclosure of the invention will be thorough and complete, and will fully convey the scope of the example embodiments to those skilled in the art.

In the drawing figures, dimensions may be exaggerated for clarity of illustration. It will be understood that when an element is referred to as being "between" two elements, it

DETAILED DESCRIPTION

The specific structural and/or functional description disclosed herein is merely illustrative for the purpose of describing various embodiments of the concepts of the present invention. It should be understood, therefore, that various other embodiments and/or variations of the described embodiments may be implemented by those with ordinary skill in the art to which the present invention pertains without departing from the scope of the concepts of the present invention.

The described embodiments are illustrated in simplified drawings and are described herein in sufficient detail to enable the skilled person to practice the invention without undue experimentation. However, the invention and the described embodiments should not be construed as limited to the specified disclosures but may be variously modified and may have various other configurations. Therefore, the present invention is intended to include all changes, modifications, equivalents, and/or substitutes that do not depart from the spirit and technical scope of the present invention.

Moreover, while terms such as "first" and "second" may be used to describe various components, such components must not be understood as being limited to the above terms. The above terms are used only to distinguish similar components from each other. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "between," "immediately between" or "adjacent to" and "directly adjacent to" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

In describing those embodiments, description will be omitted for techniques that are well known to the art to which the present disclosure pertains, and are not directly related to the present disclosure. This intends to disclose the gist of the present disclosure more clearly by omitting unnecessary description.

Hereinafter, exemplary embodiments of the present disclosure will be described in detail with reference to the accompanying drawings in order for those skilled in the art to be able to readily implement the technical spirit of the present disclosure.

Figure 1:
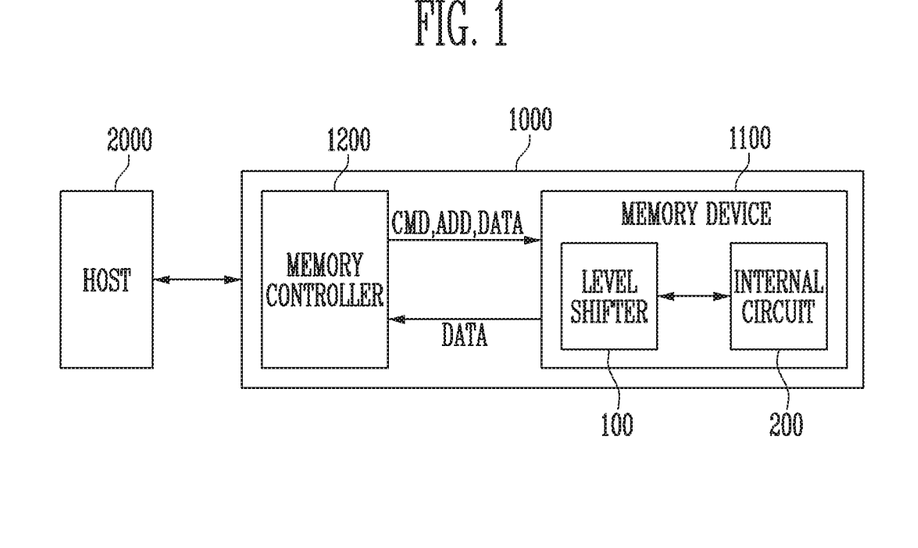
FIG. 1 is a diagram illustrating a memory system in accordance with an embodiment of the present disclosure.

FIG. 1 is a diagram illustrating a memory system 1000 in accordance with an embodiment of the present disclosure.

Referring to FIG. 1, the memory system 1000 may include a memory device 1100 for storing data and a memory controller 1200 for controlling the memory device 1100 under the control of a host 2000.

The host 2000 may communicate with the memory system 1000 by using an interface protocol such as peripheral component interconnect express (PCI-e or PCIe), advanced technology attachment (ATA), serial ATA (SATA), parallel ATA (PATA), or serial attached SCSI (SAS). Interface protocols between the host 2000 and the memory system 1000 are not limited to the above-described examples, and may also be one of interface protocols such as a universal serial bus (USB), a multi-media card (MMC), an enhanced small disk interface (ESDI), and integrated drive electronics (IDE).

The memory device 1100 operates under the control of the memory controller 1200. In an embodiment, the memory device 1100 may be a flash memory device, e.g., a NAND or a NOR flash memory device. The memory device 1100 may include a memory cell array having a plurality of memory blocks. Each memory block may comprise a plurality of pages with page including a plurality of memory cells. The memory device may preferably have a three-dimensional structure for increased integration density.

In operation, the memory device 1100 receives a command CMD and an address ADD from the memory controller 1200 through a channel, and accesses an area of the memory cell array, which is selected by the address ADD. That is, the memory device 1100 performs an internal operation corresponding to the command CMD on the area selected by the address ADD. The memory device 1100 may also receive data from the memory controller 1200 through the channel. For example, in a program operation the memory device 1100 receives a program command CMD, an address ADD, and data from the memory controller 1200 through a channel, and accesses an area of the memory cell array, which is selected by the address ADD for writing the data. Also, in a read operation, the memory device 1100 receives a read command CMD, and an address ADD from the memory controller 1200 through a channel, and accesses an area of the memory cell array, which is selected by the address ADD for reading the data. The memory device 1100 may then transfer the read data to the memory controller 1200 via another channel.

The memory device 1100 may include a level shifter 100 and an internal circuit 200. The level shifter 100 shifts voltage levels of signals such as a command CMD, an address ADD, and data DATA, which are received from the memory controller 1200, and outputs the shifted voltages of the received signals to the internal circuit 200.

The internal circuit 200 may include the memory cell array and a peripheral circuit. The memory cell array includes a plurality of memory cells for storing the data. The peripheral circuit includes a plurality of circuits for performing the various operations on the memory cell array, such as a program operation, a read operation, and an erase operation on the memory cell array.

The memory controller 1200 may control the operations of the memory system 1000, and data exchange between the host 2000 and the memory device 1100. For example, the memory controller 1200 may control the memory device 1100 in response to a request from the host 2000 to program data, read data, or erase programmed data. For example, the memory controller 1200 may output a command CMD, an address ADD, and data DATA, which correspond to each of the overall operations, in response to a request from the host 2000. The memory controller 1200 may receive data DATA and output the received data DATA to the host 2000.

The memory device 1100 and the memory controller 1200 may use different power supply voltages. Therefore, the potential levels of a signal which is used in or generated by the memory device 1100 and a corresponding signal used in or generated by the memory controller 1200 may be different from each other.

The memory device 1100 of the memory system 1000 may shift 10o potential levels of signals (e.g., a command CMD, an address ADD, and data DATA) received from the memory controller 1200 to potential levels suitable for the internal circuit 200 by using the level shifter 100 included in the memory device 1100.

In the embodiment of the present disclosure, an example in which the level shifter 100 is included in the memory device 1100 is described. However, the present disclosure is not limited thereto. The level shifter 100 may be employed in various electronic circuits using power supply voltages having different levels.

Figure 2:
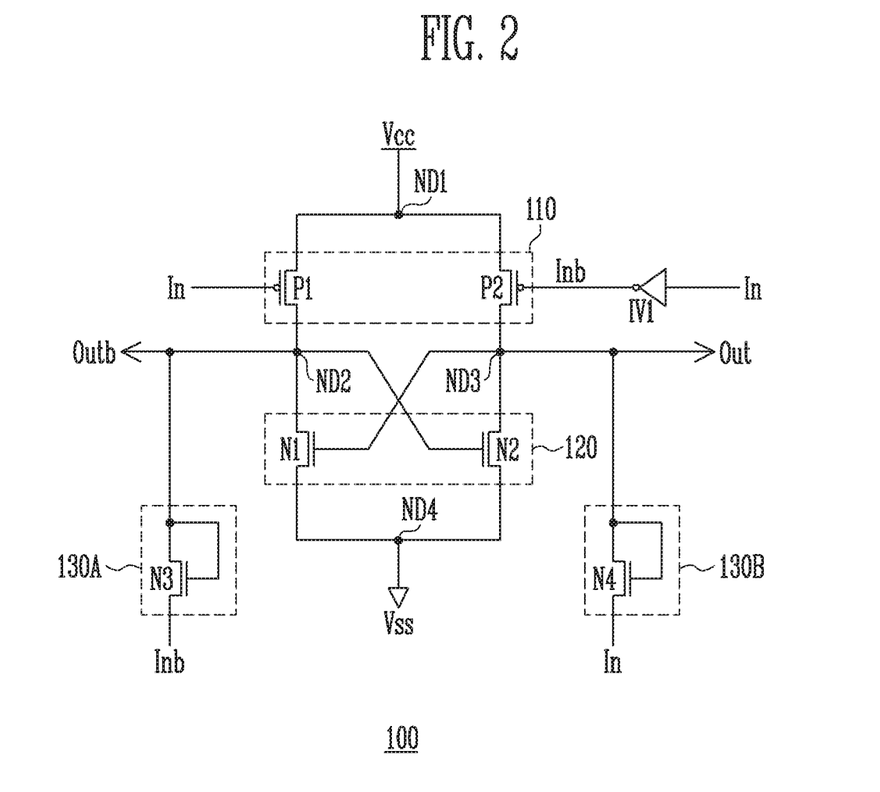
FIG. 2 is a circuit diagram illustrating a level shifter in accordance with an embodiment of the present disclosure.

FIG. 2 is a circuit diagram illustrating a level shifter in accordance with an embodiment of the present disclosure. The level shifter of FIG. 2 may be employed, for example, as the level shifter 100 of FIG. 1.

Referring to FIG. 2, the level shifter 100 may include a pull-up unit 110, a pull-down unit 120, a first discharge unit 130A, and a second discharge unit 130B.

The pull-up unit 110 supplies an internal power supply voltage Vcc to a first output node ND3 and a second output node ND2 in response to an input signal In and an inverted input signal Inb. The first output node ND3 outputs an output signal Out, and the potential level of the first output node ND3 may be the potential level of the output signal Out. The second output node ND2 outputs an inverted output signal Outb, and the potential level of the second output node ND2 may be the potential level of the inverted output signal Outb.

The pull-up unit 110 may include a PMOS transistor P1 and a PMOS transistor P2. The PMOS transistor P1 is coupled between a node ND1 to which the internal power supply voltage Vcc is supplied and the second output node ND2. The PMOS transistor P1 is turned on or turned off in response to the input signal In to apply the internal power supply voltage Vcc to the second output node ND2. The PMOS transistor P2 is coupled between the node ND1 and the first output node ND3. The PMOS transistor P2 is turned on or off in response to the inverted input signal Inb to apply the internal power supply voltage Vcc to the first output node ND3.

The pull-up unit 110 may be coupled to an inverter IV1 that outputs the inverted input signal Inb to the gate of the PMOS transistor P2 by inverting the input signal In. The input signal In may be inputted to the gate of the PMOS transistor P1.

The pull-down unit 120 discharges the potential level of the first output node ND3 or the second output node ND2 to the level of a ground voltage Vss in response to the potential levels of the first output node ND3 and the second output node ND2.

The pull-down unit 120 may include an NMOS transistor N1 and an NMOS transistor N2. The NMOS transistor N1 is coupled between the second output node ND2 and a node ND4 to which the ground voltage Vss is supplied. The NMOS transistor N1 is turned on or turned off in response to the potential level of the first output node ND3 to discharge the potential level of the second output node ND2 to the level of the ground voltage Vss or maintain the potential level of the second output node ND2. The NMOS transistor N2 is coupled between the first output node ND3 and the node ND4. The NMOS transistor N2 is turned on or turned off in response to the potential level of the second output node ND2 to discharge the potential level of the first output node ND3 to the level of the ground voltage Vss or maintain the potential of the first output node ND3.

The first discharge unit 130A is coupled to the second output node ND2. The first discharge unit 130A discharges the potential level of the second output node ND2 in response to the inverted input signal Inb.

The first discharge unit 130A may include an NMOS transistor N3. A drain of the NMOS transistor N3 is coupled to the second output node ND2, a source of the NMOS transistor N3 is coupled to a node to which the inverted input signal INb is applied, and a gate of the NMOS transistor N3 is coupled to the second output node ND2. That is, the NMOS transistor N3 is diode-coupled to the second output node ND2.

The first discharge unit 130A discharges the potential level of the second output node ND2 when the inverted input signal Inb has the level of the ground voltage Vss.

The second discharge unit 130B is coupled to the first output node ND3. The second discharge unit 130B discharges the potential level of the first output node ND3 in response to the input signal In.

The second discharge unit 130B may include an NMOS transistor N4. A drain of the NMOS transistor N4 is coupled to the first output node ND3, a source of the NMOS transistor N4 is coupled to a node to which the input signal In is applied, and a gate of the NMOS transistor N4 is coupled to the first output node ND3. That is, the NMOS transistor N4 is diode-coupled to the first output node ND3.

The second discharge unit 130B discharges the potential level of the first output node ND3 when the input signal In has the level of the ground voltage Vss.

The input signal In may include signals input from the outside (e.g., the memory device 1100), such as the command CMD, the address ADD, and the data DATA, which are described in FIG. 1. The output signal Out may include signals output from the level shifter 100 to the internal circuit 200.

Figure 3:
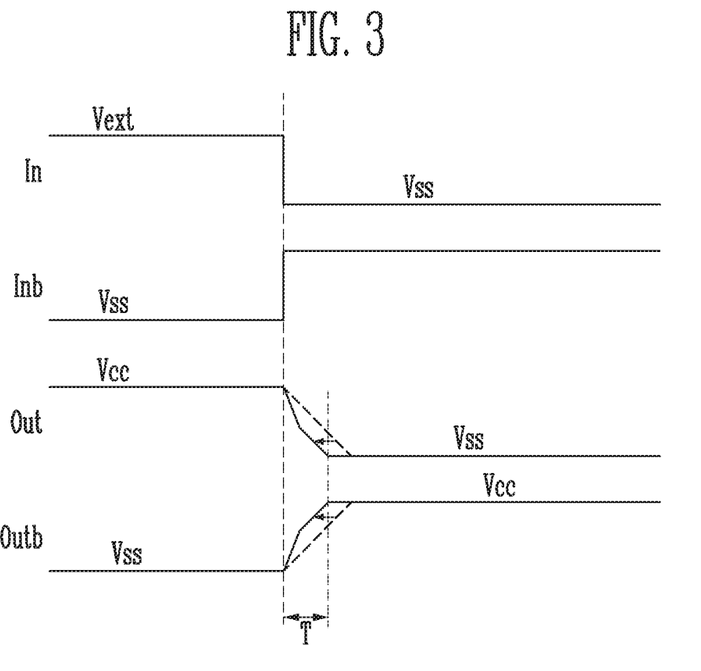
FIG. 3 is a waveform diagram illustrating an operation of a level shifter in accordance with an embodiment of the present disclosure.

FIG. 3 is a waveform diagram illustrating an operation of a level shifter in accordance with an embodiment of the present disclosure. The level shifter may be the level shifter 100 of FIG. 2.

Referring to FIGS. 2 and 3, the operation of the level shifter 100 will be described as follows.

When the input signal In having a first logic level (e.g., the level of an external power supply voltage Vext) is applied, the PMOS transistor P2 of the pull-up unit 110 is turned on in response to the inverted input signal Inb having a second logic level (e.g., the level of a ground voltage Vss). Therefore, the internal power supply voltage Vcc is applied to the first output node ND3. The PMOS transistor P1 of the pull-up unit 110 is turned off in response to the input signal In having the first logic level Vext. The external power supply voltage Vext preferably has a potential level greater than that of the internal power supply voltage Vcc.

The NMOS transistor N1 of the pull-down unit 120 is turned on in response to the potential level Vcc of the first output node ND3. The potential level of the second output node ND2 is discharged to the level of the ground voltage Vss through the node ND4. The NMOS transistor N2 of the pull-down unit 120 is turned off in response to the level of the ground voltage Vss of the discharged second output node ND2.

The first discharge unit 130A may more rapidly discharge the potential level of the second output node ND2 to the level of the ground voltage Vss in response to the inverted input signal Inb having the second logic level Vss. Accordingly, the second output node ND2 outputs the inverted output signal Outb having the level of the ground voltage Vss.

In addition, the discharge operation of the second discharge unit 130B is inactivated in response to the input signal In having the first logic level Vext. Thus, the first output node ND3 outputs the output signal Out having the level of the internal power supply voltage Vcc.

When the level of the input signal In is transitioned from the first logic level Vext to the second logic level Vss, the PMOS transistor P1 of the pull-up unit 110 is turned on in response to the input signal In having the second logic level Vss. Therefore, the internal power supply voltage Vcc is applied to the second output node ND2. The PMOS transistor P2 of the pull-up unit 110 is turned off in response to the inverted input signal Inb.

The NMOS transistor N2 of the pull-down unit 120 is turned on in response to the potential level Vcc of the second output node ND2. The potential level of the first output node ND3 is discharged to the level of the ground voltage Vss. The NMOS transistor N1 of the pull-down unit 120 is turned off in response to the potential level Vss of the discharged first output node ND3.

The discharge operation of the first discharge unit 130A is inactivated in response to the inverted input signal Inb having a high level. Thus, the second output node ND2 outputs the inverted output signal Outb having the level of the internal power supply voltage Vcc.

In addition, the second discharge unit 130B may more rapidly discharge the potential level of the first output node ND3 to the level of the ground voltage Vss in response to the input signal In having the second logic level Vss. Accordingly, the first output node ND3 outputs the output signal Out having the level of the ground voltage Vss. Since the potential level of the first output node ND3 is rapidly discharged to the level of the ground voltage Vss, the NMOS transistor N1 is rapidly turned off. Therefore, the potential level of the second output node ND2 is rapidly increased to the level of the internal power supply voltage Vcc, so that the second output node ND2 outputs the inverted output signal Outb.

As described above, in accordance with an embodiment of the present disclosure, when the level of the input signal In is transitioned from the first logic level Vext to the second logic level Vss, the second discharge unit 130B is activated, so that the first output node ND3 may be more rapidly discharged. Accordingly, a shift time T of the output signal Out and the inverted output signal Outb may be shortened as shown in FIG. 3. In addition, when the level of the inverted input signal Inb is transitioned from the first logic level Vext to the second logic level Vss, the first discharge unit 130A is activated, so that the second output node ND2 may be more rapidly discharged.

Further, since the shift time of the output signal Out and the inverted output signal Outb is shortened, the PMOS transistor of the pull-up unit 110 may be designed such that its size is decreased. Accordingly, the area of the circuit can be reduced.

Figure 4:
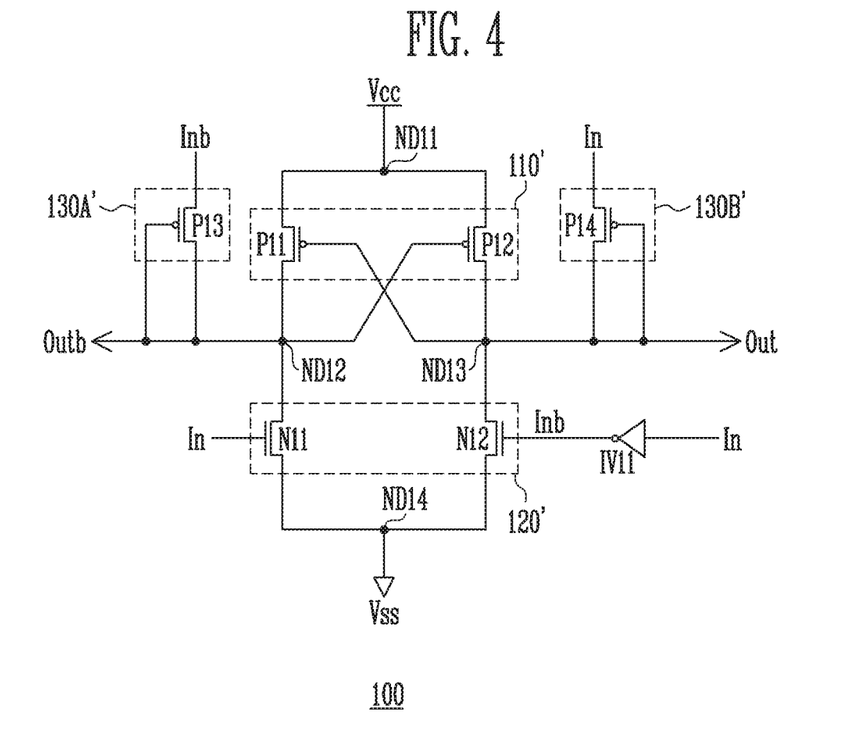
FIG. 4 is a circuit diagram illustrating a level shifter in accordance with an embodiment of the present disclosure.

FIG. 4 is a circuit diagram illustrating a level shifter in accordance with an embodiment of the present disclosure.

Referring to FIG. 4, the level shifter 100 may include a pull-up unit 110', a pull-down unit 120', a first charge unit 130A, and a second charge unit 130B'.

The pull-up unit 110' supplies an internal power supply voltage Vcc to a first output node ND13 and a second output node ND12 in response to potential levels of the first output node ND13 and the second potential node ND12. The first output node ND13 outputs an output signal Out, and potential level of the first output node ND13 may be the potential level of the output signal Out. The second output node ND12 outputs an inverted output signal Outb, and the potential level of the second output node ND12 may be the potential level of the inverted output signal Outb.

The pull-up unit 110' may include a PMOS transistor P11 and a 10o PMOS transistor P12. The PMOS transistor P11 is coupled between a node ND11 to which the internal power supply voltage Vcc is supplied and the second output node ND12. The PMOS transistor P11 is turned on or off in response to the potential level of the first output node ND13 to apply the internal power supply voltage Vcc to the second output node ND12. The PMOS transistor P12 is coupled between the node ND11 to which the internal power supply voltage Vcc is supplied and the first output node ND13. The PMOS transistor P12 is turned on or off in response to the potential level of the second output node ND12 to apply the internal power supply voltage Vcc to the first output node ND13.

The pull-down unit 120' discharges the potential level of the first output node ND13 or the second output node ND12 to the level of a ground voltage Vss in response to an input signal In and an inverted input signal Inb.

The pull-down unit 120' may include an NMOS transistor N11 and an NMOS transistor N12. The NMOS transistor N11 is coupled between the second output node ND12 and a node ND14 to which the ground voltage Vss is supplied.

The NMOS transistor N11 is turned on or turned off in response to the input signal In to discharge the potential level of the second output node ND12 to the level of the ground voltage Vss or maintain the potential level of the second output node ND12. The NMOS transistor N12 is coupled between the first output node ND13 and the node ND14 to which the ground voltage Vss is supplied. The NMOS transistor N12 is turned on or turned off in response to the inverted input signal Inb to discharge the potential level of the first output node ND13 to the level of the ground voltage Vss or maintain the potential level of the first node ND13.

The pull-down unit 120' may be coupled to an inverter IV11 that outputs the inverted input signal Inb by inverting the input signal In.

The first charge unit 130A' is coupled to the second output node ND12. The first charge unit 130A' increases the potential level of the second output node ND12 in response to the inverted input signal Inb.

The first charge unit 130A' may include a PMOS transistor P13. A drain of the PMOS transistor P13 is coupled to the second output node ND12, a source of the PMOS transistor P13 is coupled to a node to which the inverted input signal Inb is applied, and a gate of the PMOS transistor P13 is coupled to the second output node ND12. That is, the PMOS transistor P13 is diode-coupled to the second output node ND12.

The first charge unit 130A' rapidly increases the potential level of the second output node ND12 when the inverted input signal Inb has a first logic level (e.g., the level of an external power supply voltage Vext).

The second charge unit 130B' is coupled to the first output node ND13. The second charge unit 130B' increases the potential level of the first output node ND13 in response to the input signal In.

The second charge unit 130B' may include a PMOS transistor P14. A drain of the PMOS transistor P14 is coupled to the first output node ND13, a source of the PMOS transistor P14 is coupled to a node to which the input signal In is applied, and a gate of the PMOS transistor P14 is coupled to the first output node ND13. That is, the PMOS transistor P14 is diode-coupled to the first output node ND13.

The second discharge unit 130B' rapidly increases the potential level of the first output node ND13 when the input signal In has the first logic level (e.g., the level of the external power supply voltage Vext).

The input signal In may include signals input from the outside (e.g., the memory device 1100), such as the command CMD, the address ADD, and the data DATA, which are described in FIG. 1. The output signal Out may include signals output from the level shifter 100 to the internal circuit 200.

An operation of the level shifter 100 in accordance with an embodiment of the present disclosure will be described as follows with reference to FIGS. 3 and 4.

When the input signal In having a first logic level (e.g., the level of an external power supply voltage Vext) is applied, the NMOS transistor N11 of the pull-down unit 120' is turned on in response to the input signal In to discharge the potential level of the second output node ND12 to a second logic level (e.g., the level of the ground voltage Vss).

The PMOS transistor P12 of the pull-up unit 110' is turned on in response to the potential level of the second output node ND12, which is discharged to the level of the ground voltage Vss. Thus, the internal power voltage Vcc is applied to the first output node ND13, and the first output node ND13 outputs the output signal Out having the level of the internal power supply voltage Vcc.

When the level of the input signal In is transitioned from the first logic level Vext to the second logic level Vss, the NMOS transistor N11 of the pull-down unit 110' is turned off in response to the input signal In, and the NMOS transistor N12 of the pull-down unit 110' is turned on in response to the inverted input signal Inb having a high level. Thus, the first output node ND13 is discharged to the level of the ground voltage Vss. The PMOS transistor P11 of the pull-up unit 110' is turned on in response to the potential level of the first input node ND13, which is discharged to the level of the ground voltage Vss. Thus, the internal power supply voltage Vcc is applied to the second output node ND12, and the first charge unit 130A' more rapidly increases the potential level of the second output node ND12 in response to the inverted input signal Inb having the first logic level Vext.

When the potential level of the second output node ND12 is rapidly increased, the PMOS transistor P12 of the pull-up unit 110' is rapidly turned off. Therefore, the potential level of the first output node ND13 is rapidly discharged to the level of the ground voltage Vss.

As described above, in accordance with the embodiment of the present disclosure, when the level of the input signal In is transitioned from the first logic level Vext to the second logic level Vss, the first charge unit 130A' is activated, so that the potential level of the second output node ND12 may be more rapidly increased. When the potential level of the second output node ND12 is rapidly increased, the PMOS transistor P12 is rapidly turned off, so that the potential level of the first output 10o node ND13 is rapidly discharged to the level of the ground voltage Vss. Accordingly, a shift time T of the output signal Out and the inverted output signal Outb may be shortened as shown in FIG. 3. Further, when the level of the inverted input signal Inb is transitioned from the first logic level Vext to the second logic level Vss, the second charge unit 130B' is activated, so that the potential of the first output node ND13 may be more rapidly increased.

Figure 5:
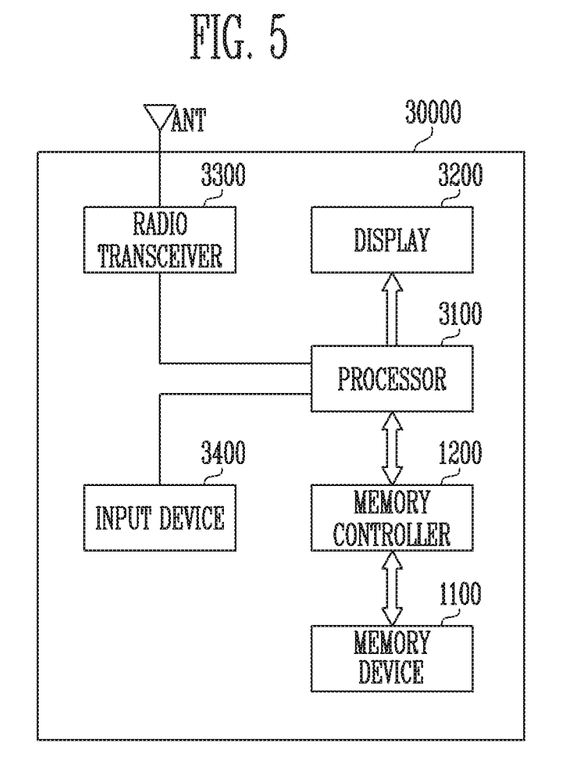
FIG. 5 is a diagram illustrating an example of a memory system in accordance with an embodiment of the present disclosure.

FIG. 5 is a diagram illustrating an example of a memory system 30000 according to an embodiment of the present disclosure.

Referring to FIG. 5, the memory system 30000 may be implemented as a cellular phone, a smart phone, a tablet personal computer (PC), a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit and receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the memory device 1100. Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100. Also, the memory controller 1200 may be implemented with the memory controller shown in FIG. 1, and the memory device 1100 may be implemented with the memory device shown in FIG. 1.

Figure 6:
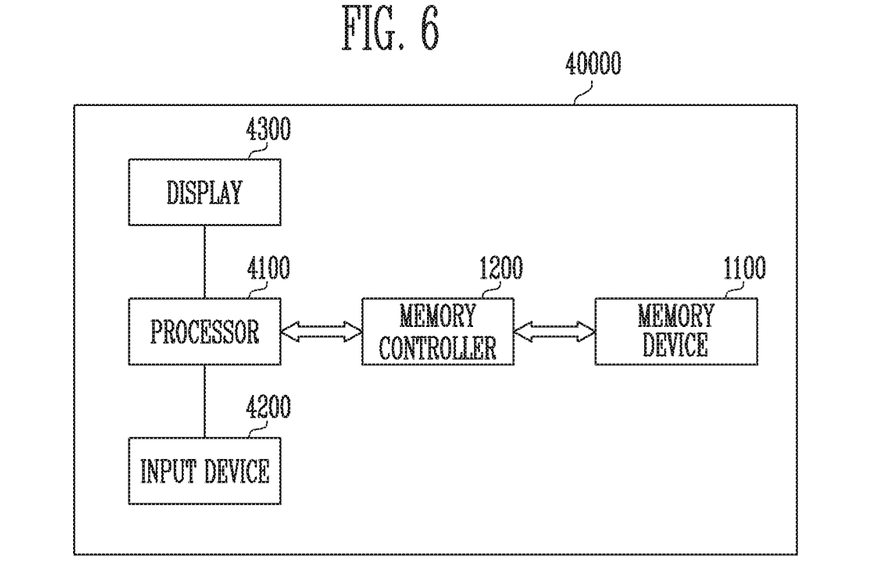
FIG. 6 is a diagram illustrating an example of a memory system in accordance with an embodiment of the present disclosure.

FIG. 6 is a diagram illustrating an example of a memory system 40000 in accordance with an embodiment of the present disclosure.

Referring to FIG. 6, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a memory controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100. Also, the memory controller 1200 may be implemented with the memory controller shown in FIG. 1, and the memory device 1100 may be implemented with the memory device shown in FIG. 1.

Figure 7:
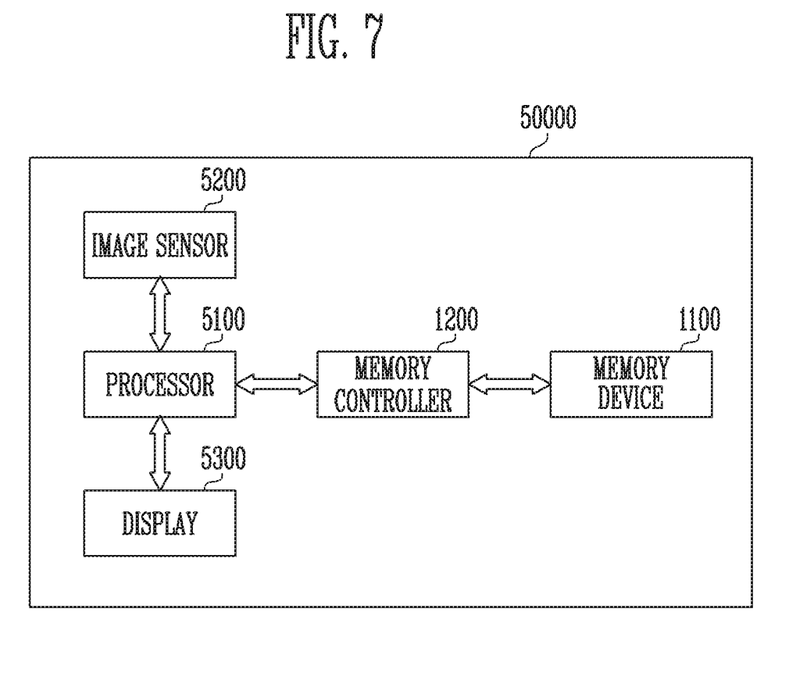
FIG. 7 is a diagram illustrating an example of a memory system in accordance with an embodiment of the present disclosure.

FIG. 7 is a diagram illustrating an example of a memory system 50000 in accordance with an embodiment of the present disclosure.

Referring to FIG. 7, the memory system 50000 may be implemented as an image processing device, e.g., a digital camera, a mobile terminal having a digital camera attached thereto, a smart phone having a digital camera attached thereto, or a tablet personal computer (PC) having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100. Also, the memory controller 1200 may be implemented with the memory controller shown in FIG. 1, and the memory device 1100 may be implemented with the memory device shown in FIG. 1.

Figure 8:
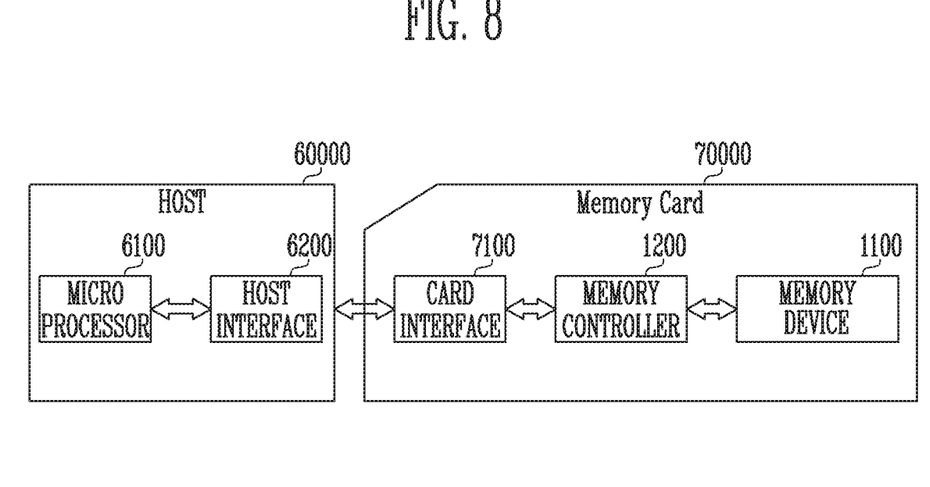
FIG. 8 is a diagram illustrating an example of a memory system in accordance with an embodiment of the present disclosure.

FIG. 8 is a diagram illustrating an example of a memory system 70000 in accordance with an embodiment of the present disclosure.

Referring to FIG. 8, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a personal computer (PC), a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor 6100. In addition, the memory controller 1200 may be implemented with the memory controller shown in FIG. 1, and the memory device 1100 may be implemented with the memory device shown in FIG. 1.

In accordance with the present disclosure, in the level shifter, the level of an output signal may be rapidly switched when the level of an input signal is transitioned from a first level to a second level. Accordingly, the level shifter may be designed to decrease the size of the pull-up unit.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:
1. A level shifter comprising:
   a pull-up unit configured to supply an internal power supply voltage to a first output node or a second output node in response to an input signal and an inverted input signal;

a pull-down unit configured to apply a ground voltage to the first output node or the second output node in response to potential levels of the first output node and the second output node; and a discharge unit configured to discharge the potential level of the first output node or the second output node in response to the input signal and the inverted input signal.

2. The level shifter of claim 1, wherein the pull-up unit includes:

a first transistor configured to supply the internal power supply voltage to the first output node in response to the input signal; and a second transistor configured to supply the internal power supply voltage to the second output node in response to the inverted input signal.

3. The level shifter of claim 1, wherein the pull-down unit includes:

a first transistor configured to apply the ground voltage to the second output node in response to the potential level of the first output node; and a second transistor configured to apply the ground voltage to the first output node in response to the potential level of the second output node.

4. The level shifter of claim 1, wherein the discharge unit includes:

a first discharge unit coupled to the second output node, the first discharge unit discharging the potential level of the second output node when the inverted input signal having the level of the ground voltage is applied; and a second discharge unit coupled to the first output node, the second discharge unit discharging the potential level of the first output node when the input signal having the level of the ground voltage is applied.

5. The level shifter of claim 4, wherein the first discharge unit includes a first transistor diode-coupled to the second output node, and the second discharge unit includes a second transistor diode-coupled to the first output node.

6. The level shifter of claim 5, wherein a drain of the first transistor is coupled to the second output node, a source of the first transistor is coupled to a node to which the inverted input signal is applied, and a gate of the first transistor is coupled to the second output node.

7. The level shifter of claim 5, wherein a drain of the second transistor is coupled to the first output node, a source of the second transistor is coupled to a node to which the input signal is applied, and a gate of the second transistor is coupled to the first output node.

8. A memory system comprising:

a memory device including an internal circuit;

a memory controller configured to output an input signal for controlling the memory device in response to a request from a host; and a level shifter configured to shift the level of the input signal and output the shifted input signal to the internal circuit, wherein the level shifter includes:

a pull-up unit configured to supply an internal power supply voltage to a first output node and a second output node in response to the input signal and an inverted input signal;

a pull-down unit configured to apply a ground voltage to the first output node or the second output node in response to potential levels of the first output node and the second node; and a discharge unit configured to discharge the potential level of the first output node or the second output node in response to the input signal and the inverted input signal.

9. The memory system of claim 8, wherein the pull-up unit includes:

a first transistor configured to supply the internal power supply voltage to the first output node in response to the input signal; and a second transistor configured to supply the internal power supply voltage to the second output node in response to the inverted input signal.

10. The memory system of claim 8, wherein the pull-down unit includes:

a first transistor configured to apply the ground voltage to the second output node in response to the potential level of the first output node; and a second transistor configured to apply the ground voltage to the first output node in response to the potential level of the second output node.

11. The memory system of claim 8, wherein the discharge unit includes:

a first discharge unit coupled to the second output node, the first discharge unit discharging the potential level of the second output node when the inverted input signal having the level of the ground voltage is applied; and a second discharge unit coupled to the first output node, the second discharge unit discharging the potential level of the first output node when the input signal having the level of the ground voltage is applied.

12. The memory system of claim 11, wherein the first discharge unit includes a first transistor diode-coupled to the second output node.

13. The memory system of claim 11, wherein the second discharge unit includes a second transistor diode-coupled to the first output node.

* * * * *